(12) United States Patent
Kaper et al.

(10) Patent No.: US 7,994,550 B2
(45) Date of Patent: Aug. 9, 2011

(54) SEMICONDUCTOR STRUCTURES HAVING BOTH ELEMENTAL AND COMPOUND SEMICONDUCTOR DEVICES ON A COMMON SUBSTRATE

(75) Inventors: Valery S. Kaper, Winchester, MA (US); John P. Bettencourt, Danvers, MA (US); Jeffrey R. LaRoche, Lowell, MA (US); Kamal Tabatabaie, Sharon, MA (US)

(73) Assignee: Raytheon Company, Waltham, MA (US)

( * ) Notice: Subject to any disclaimer, the term of this patent is extended or adjusted under 35 U.S.C. 154(b) by 122 days.

(21) Appl. No.: 12/470,633

(22) Filed: May 22, 2009

(65) Prior Publication Data

US 2010/0295104 A1    Nov. 25, 2010

(51) Int. Cl.
*H01L 21/02* (2006.01)
(52) U.S. Cl. .... 257/289; 257/499; 257/724; 257/E21.01
(58) Field of Classification Search .................. None
See application file for complete search history.

(56) References Cited

U.S. PATENT DOCUMENTS

| | | |
|---|---|---|
| 4,523,368 A | 6/1985 | Feist |
| 4,774,205 A | 9/1988 | Choi et al. |
| 4,982,256 A | 1/1991 | Suzuki |
| 5,308,444 A | 5/1994 | Fitzgerald, Jr. et al. |
| 5,361,273 A | 11/1994 | Kosaka |
| 5,373,171 A | 12/1994 | Imai et al. |
| 5,766,783 A | 6/1998 | Utsumi et al. |
| 5,903,015 A | 5/1999 | Shiomi et al. |
| 6,171,936 B1 | 1/2001 | Fitzgerald |
| 6,246,708 B1 | 6/2001 | Thornton et al. |
| 6,703,144 B2 | 3/2004 | Fitzgerald |
| 6,713,326 B2 | 3/2004 | Cheng et al. |
| 7,256,142 B2 | 8/2007 | Fitzgerald |
| 7,301,180 B2 | 11/2007 | Lee et al. |

(Continued)

FOREIGN PATENT DOCUMENTS

JP   05 259433   10/1993

(Continued)

OTHER PUBLICATIONS

Herrick et al., "Direct Growth of Iii-V Devices on Silicon", Matter Res. Soc. Symp. Proc., vol. 1068, 2008, pp. 1-6.

(Continued)

*Primary Examiner* — Evan Pert
*Assistant Examiner* — Scott Wilson
(74) *Attorney, Agent, or Firm* — Daly, Crowley, Mofford & Durkee, LLP (57) ABSTRACT

A semiconductor structure comprising: a substrate; a seed layer supported by the substrate; an elemental semiconductor layer disposed over a first portion of the seed layer; and a compound semiconductor layer disposed on a second portion of the seed layer. The first portion of the seed layer is electrically insulated from the second portion of the seed layer. A first semiconductor device is formed in the elemental semiconductor layer. A second semiconductor device is formed in the compound semiconductor layer. The second semiconductor device includes: a first electrode in contact with a first region of the compound semiconductor layer; a second electrode in contact with a second region of the compound semiconductor layer; and a third electrode. The third electrode controls carriers passing in a third region of the compound semiconductor layer disposed between the first region and the second region. A fourth electrode is in electrical contact with the second portion of the seed layer.

15 Claims, 10 Drawing Sheets

U.S. PATENT DOCUMENTS

| | | |
|---|---|---|
| 7,332,417 B2 | 2/2008 | Westhoff et al. |
| 7,390,701 B2 | 6/2008 | Cheng et al. |
| 7,465,619 B2 | 12/2008 | Fitzgerald |
| 2003/0022438 A1 | 1/2003 | Callaway, Jr. et al. |
| 2005/0139838 A1 | 6/2005 | Murata et al. |
| 2006/0054926 A1 | 3/2006 | Lahreche |
| 2006/0284247 A1* | 12/2006 | Augustine et al. ............ 257/338 |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2008/0070355 A1* | 3/2008 | Lochtefeld et al. ........... 438/172 |
| 2008/0149915 A1 | 6/2008 | Mori et al. |

FOREIGN PATENT DOCUMENTS

| | | |
|---|---|---|
| JP | 06 244502 | 9/1994 |

OTHER PUBLICATIONS

Dohrman et al., "Fabrication of Silicon on Lattice-Engineered Substrate (SOLES) as a Platform for Monolithic Integration of CMOS and Optoelectronic Devices", Materials Science and Engineering B, 2006, pp. 235-237.

Notification of Transmittal of the International Search Report and the Written Opinion of the International Searching Authority, or the Declaration, PCT/US2010/021443 dated Apr. 14, 2010, 6 pages.

Written Opinion of the International Searching Authority, PCT/US2010/021443 dated Apr. 14, 2010, 7 pages.

"Chapter 12: Metallization" In: Quirk M, Serda J: "Semiconductor Manufacturing Technology", Jan. 1, 2001, Prentice-Hall, Inc., Upper Saddel River, NJ, US, XP002576021. ISBN: 0130815200, pp. 299-333.

Notification of Transmittal of the International Search Report and the Written Opinion of the International Searching Authority, or the Declaration, PCT/US2010/021444 dated Apr. 13, 2010, 6 pages.

Written Opinion of the International Searching Authority, PCT/US2010/021444 dated Apr. 13, 2010, 8 pages.

Notification of Transmittal of the International Search Report and the Written Opinion of the International Searching Authority, or the Declaration, PCT/US2007/022325, date of mailing Apr. 10, 2008, 5 pages.

The Written Opinion of the International Searching Authority, PCT/US2007/022325, date of mailing Apr. 10, 2008, 7 pages.

Miskys et al., "AlN/diamond heterojunction diodes", Applied Physics Letters, AIP, 2003 American Institute of Physics, Melville, NY, US, vol. 82, No. 2, Jan. 13, 2003, pp. 290-292, XP012034092, ISSN: 0003-6951.

Polyakov et al., "Growth of AlBN Solid Solutions by Organometallic Vapor-Phase Epitaxy", Journal of Applied Physics, American Institute of Physics, vol. 81, No. 4, Feb. 15, 1997, pp. 1715-1719, XP012041570, ISSN: 0021-8979.

Vescan et al., "High-Temperature, High-Voltage Operation of Pulse-Doped Diamond MESFET", IEEE Electron Device Letters, vol. 18, No. 5, May 1997, pp. 222-224, XP011018247, ISSN: 0741-3106.

Edgar et al., "c-Boron-Aluminum Nitride Alloys Prepared by Ion-Beam Assisted Deposition", Thin Solid Films, Elsevier-Sequoia S.A. Lausanne, Ch, vol. 298, No. 1-2, Apr. 20, 1997, pp. 33-38, XP004125912, ISSN: 0040-6090.

U.S. Appl. No. 12/497,994, filed Jul. 6, 2009, 17 pages.

USPTO Office Action dated Jul. 19, 2010 for U.S. Appl. No. 12/497,994, 9 pages.

Response to the Office Action dated Jul. 19, 2010 for U.S. Appl. No. 12/497,994, 4 pages.

USPTO Office Action dated Dec. 29, 2010 for U.S. Appl. No. 12/497,994, 7 pages.

File downloaded for U.S. Appl. No. 12/497,994, filed Jul. 6, 2009, file through Jan. 14, 2011, 136 pages.

\* cited by examiner

SEMICONDUCTOR STRUCTURES HAVING BOTH ELEMENTAL AND COMPOUND SEMICONDUCTOR DEVICES ON A COMMON SUBSTRATE

TECHNICAL FIELD

This invention relates generally to semiconductor structures and more particularly having both elemental semiconductor devices and compound semiconductor devices on a common substrate.

BACKGROUND AND SUMMARY

As is known in the art, with the recent advances enable growth of both compound semiconductor (CS) devices, such as for example III-V FETS or opto-electric devices, and elemental semiconductor (ES) devices, such as for example CMOS devices on a common, such as a silicon, substrate. Thus, the term "compound semiconductor" usually refers to any non-homogeneous semiconductor layers (GaAs, InP, GaN, InSb, AlGaAs, AlGaN, . . . ) as opposed to "elemental semiconductors" (Si, Ge, . . . ). Compound semiconductors can be combination of two or more elements of the periodic table from columns III and V (GaAs, GaN, InP, AlGaAs, . . . ); II and VI (ZnO, CdSe, . . . ); IV-IV (SiGe, SiC), etc. The growth of both compound semiconductor (CS) devices and elemental semiconductor (ES) devices, is described in, for example, T. Ashley, L. Buckle, S. Datta, M. T. Emeny, D. G Hayes, K. P. Hilton, R. Jefferies, T. Martin, T. J. Philips, D. J. Wallis, P. J. Wilding and R. Chau, "Heterogeneous InSb quantum well transistors on silicon for ultra-high speed, low power logic applications," Electronics Letters, Vol. 43, No. 14, July 2007. S. Datta, G. Dewey, J. M. Fastenau, M. K. Hudait, D. Loubychev, W. K. Liu, M. Radosavljevic, W. Rachmady and R. Chau, "Ultrahigh-Speed 0.5 V Supply Voltage In0.7Ga0.3As Quantum-Well Transistors on Silicon Substrate," IEEE Electron Device Letters, Vol. 28, No. 8, 2007, pp. 685-687. M. K. Hudait, G. Dewey, S. Datta, J. M. Fastenau, J. Kavalieros, W. K. Liu, D. Lubyshev, R. Pillarisetty, W. Rachmady, M. Radosavljevic, T. Rakshit and Robert Chau, "Heterogeneous Integration of Enhancement Mode In0.7Ga0.3As Quantum Well Transistor on Silicon Substrate using Thin (<2 um) Composite Buffer Architecture for High-Speed and Low-Voltage (0.5V) Logic Applications," International Electron Devices Meeting (IEDM) Technical Digest, 2007, pp. 625-628.

One technique used to grow both the CS devices and ES devices on the same substrate, it to provide a substrate, such a silicon substrate. A first insulating layer, such as silicon dioxide layer, is formed on the substrate. A seed layer, such as germanium, is formed on the first insulating layer, such seed layer being provided to grow, typically epitaxially, the CS devices. A second insulating layer, such as silicon dioxide is formed on the seed layer. An ES layer, such as silicon, is formed on the second insulating layer. A portion of the ES layer and underlying portions of the second insulating layer are removed to exposed portion of the seed layer. Next, a CS layer is grown on the seed layer. Next, the ES device is formed in the ES layer, and the CS device is formed on the CS layer.

Because a CS epitaxial structure needs to be grown on top of the seed layer whose crystal structure and electronic properties are different from those of the CS layer, the CS device performance may deteriorate very significantly due to the formation of an unwanted interface layer between seed and CS layers. Integration of a CS FETs onto a non-semi-insulating and non-homogeneous silicon-based substrate poses two key challenges:

1. Minimize negative substrate effects on the device performance, most notably the substrate conduction that may prevent the complete transistor pinch-off. The lack of pinch-off results in higher device's output conductance that, in turn, leads to lower AC gain, cutoff frequency, power density and drain efficiency in the transistors used in amplifier-type circuits as well as lower isolation in the transistors used in switch-type circuits.

2. Allow for low series resistance, loss series inductance and low shunt capacitance interconnect between the individual heterogeneously integrated individual CS and silicon CMOS FETs.

In accordance with the invention, a semiconductor structure is provided comprising: a substrate; a seed layer supported by the substrate; an elemental semiconductor layer disposed over a first portion of the seed layer; and a compound semiconductor layer disposed on a second portion of the seed layer. The first portion of the seed layer is electrically insulated from the second portion of the seed layer. A first semiconductor device is formed in the elemental semiconductor layer. A second semiconductor device is formed in the compound semiconductor layer. The second semiconductor device includes: a first electrode in contact with a first region of the compound semiconductor layer; a second electrode in contact with a second region of the compound semiconductor layer; and a third electrode. The third electrode controls carriers passing in a third region of the compound semiconductor layer disposed between the first region of the compound semiconductor layer and the second region of the compound semiconductor layer. A fourth electrode is in electrical contact with the second portion of the conductive seed layer.

In one embodiment, the first, second, and fourth electrodes extend vertically downward from an upper surface of the structure.

In one embodiment, the elemental semiconductor layer is a silicon layer.

In one embodiment, the compound semiconductor layer is a III-V layer.

In one embodiment, the first semiconductor device is a MOS device.

In one embodiment, the second semiconductor device is a FET device.

In one embodiment, the third electrode is a gate electrode and wherein first and second electrodes are source and drain electrodes.

In one embodiment, the fourth electrode is in ohmic contact with the seed layer.

With such structure the first challenge is solved by providing direct control of a local electrical potential of the seed layer (e.g., germanium (Ge) layer), on top of which the CS FET epitaxial structure is deposited. This local electrical potential control is being accomplished by 1) etching away a certain shape in the CS FET and buffer vertical epitaxial structure; 2) fabricating an ohmic contact on the Ge layer and 3) isolating the Ge region under the CS FET from the rest of the Ge layer by etching a closed-shape trench in the Ge layer.

The second is solved by fabricating vertical pillars that connect the four FET electrodes (source, drain, gate, Ge layer). Following the CS FET fabrication, these pillars are formed by 1) forming a planar layer of Back-End-Of the Line (BEOL) low loss dielectric (for example BCB); 2)etching vertical holes in the BEOL dielectric; 3) filling the holes with a low resistivity metal interconnect The effect of the electrical contact to the seed layer is to reduce the effects on CS device performance as a result of a charge layer that is inadvertently formed at the interface between the seed layer and the CS layer. This charge layer is the result of a junction (either p-n or n-n or p-p) or a quantum well that is formed when two dissimilar materials are brought into intimate contact.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
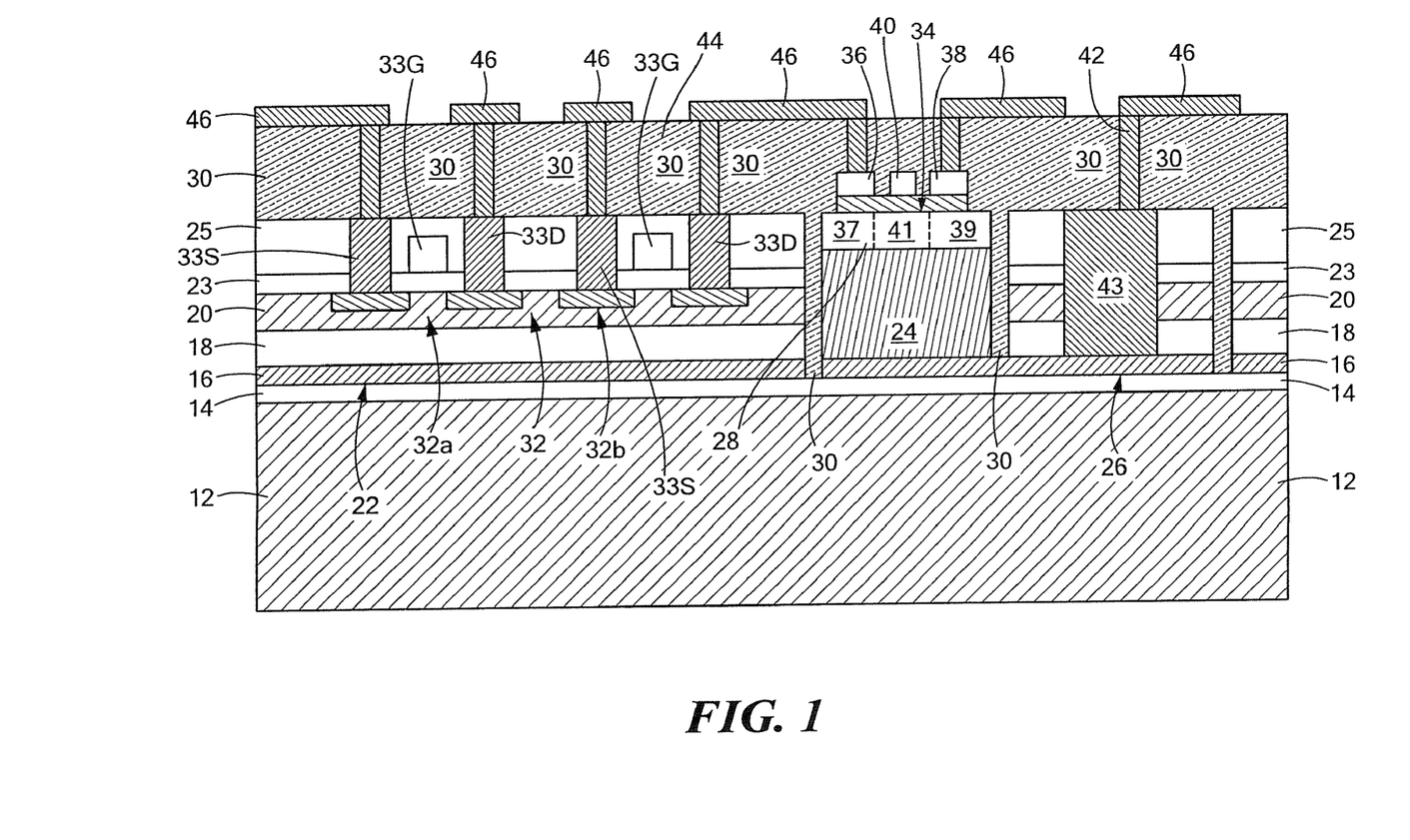
FIG. 1 is a diagrammatical cross sectional sketch of a semiconductor structure according to the invention.

Referring now to FIG. 1, a semiconductor structure 10 is shown comprising: a substrate 12, here silicon; an insulating layer 14, here silicon dioxide, on the substrate 12; a seed layer 16, here germanium, on the insulating layer 14 and hence supported by the substrate 12; a second insulating layer 18, here silicon dioxide, on the seed layer 16; an elemental semiconductor layer 20, here silicon, disposed over a first portion 22, of the seed layer 16; and a compound semiconductor layer, here III-V material, such as, for example, GaAs or InP, buffer layer 24 disposed on a second portion 26 of the seed layer 16 and an active layer 28, here the same compound semiconductor material as layer 24. The first portion 22 of the seed layer 16 is electrically insulated from the second portion 26 of the seed layer 16 by an insulating material, 30, here for example, Benzocyclobutene (BCB).

At least one first semiconductor device, here a pair CMOS transistors 32, transistor 32a and 32b, is formed in the elemental semiconductor layer 20, as shown. The CMOS transistors 32 each includes source and drain contacts 33S, 33D, and a gate contact 33G. The gate 33G contacts are disposed on an insulating layer 23, here silicon dioxide. The CMOS contacts 33S, 33D and 33G are electrically insulated by a dielectric layer 25, here silicon dioxide.

A second semiconductor device 34, here a FET, is formed in the compound semiconductor layer 28, as shown. The second semiconductor device 34 includes: a first electrode 36, here a source electrode, in ohmic contact with a first region 37 of the compound semiconductor layer 28; a second electrode 38, here a drain electrode, in ohmic contact with a second region 39 of the compound semiconductor layer 28; and a third electrode 40, here gate electrode. The third or gate electrode is in Schottky contact with a third region 41 of the compound semiconductor layer 28 and controls carriers passing in the third region 41 of the compound semiconductor layer 28 disposed between the first region 37 of the compound semiconductor layer 28 and the second region 39 of the compound semiconductor layer 28. A fourth electrode 42 is in electrical contact, here in ohmic contact, with the second portion 26 of the seed layer 16 through an extension provided by an electrically conductive column shaped structure 43. It is noted that the first, second, and fourth electrodes 36, 38, 42 (including the extension of the electrically conductive column shaped structure 43) and extend vertically downward from an upper surface 44 of the structure 10. The electrical potential difference between the fourth electrode 42 and the source electrode 37 has an effect on the CS device performance.

The purpose for the electrical contact to the seed layer is to reduce the effects on CS device performance of a charge layer that may be formed at the interface between the seed layer 16 and the CS layer 24. This charge layer is the result of a junction (either p-n or n-n or p-p) or a quantum well that is formed when two dissimilar materials, here the germanium seed layer 16 and GaAs or InP buffer layer 24, are brought into intimate contact.

Figure 2A:
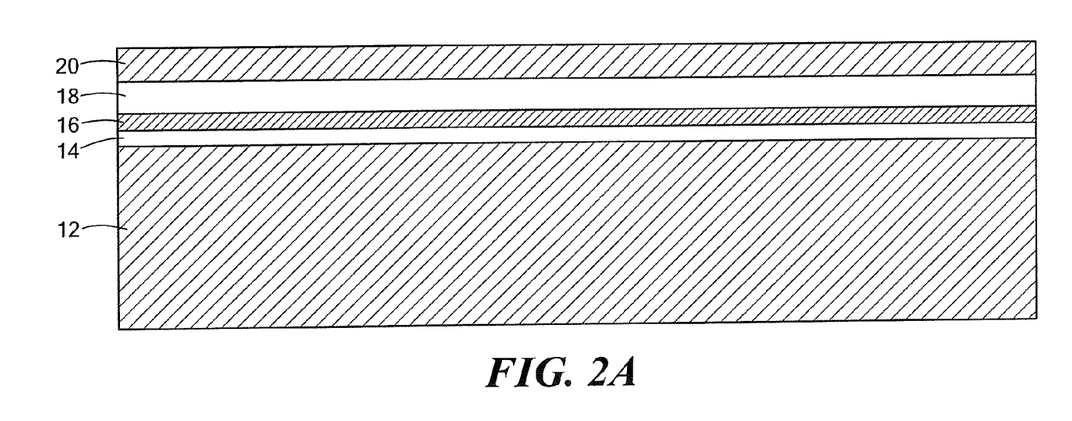
FIGS. 2A-2N are diagrammatical cross sectional sketches of the semiconductor structure of FIG. 1 at various stages in the fabrication thereof according to the invention.
Figure 2B:
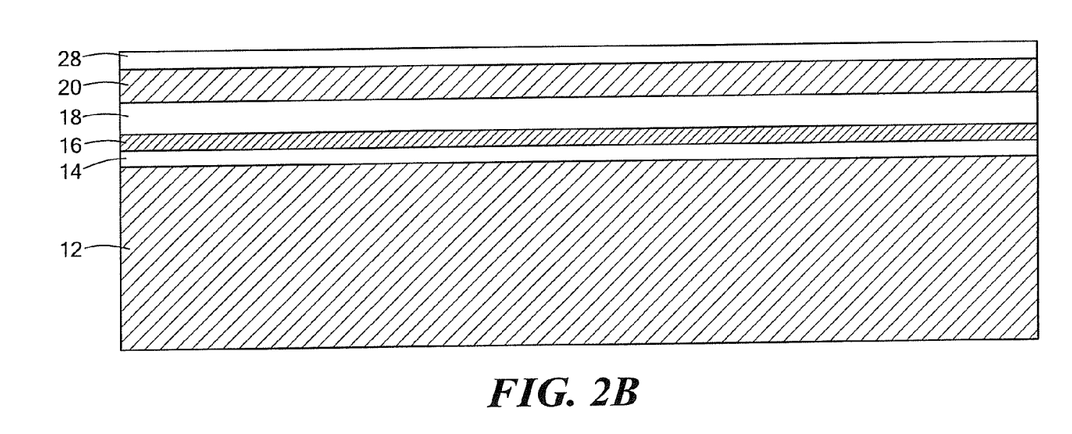
Figure 2C:
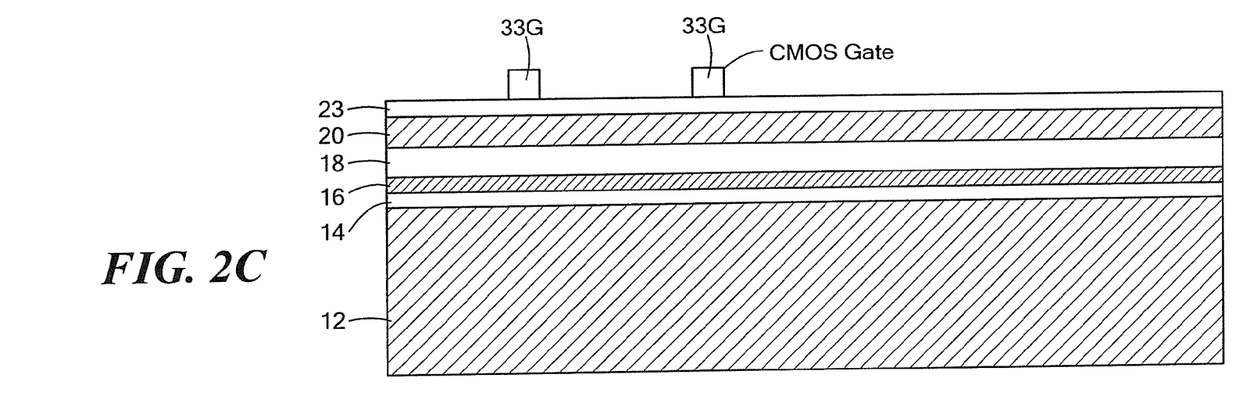
Figure 2D:
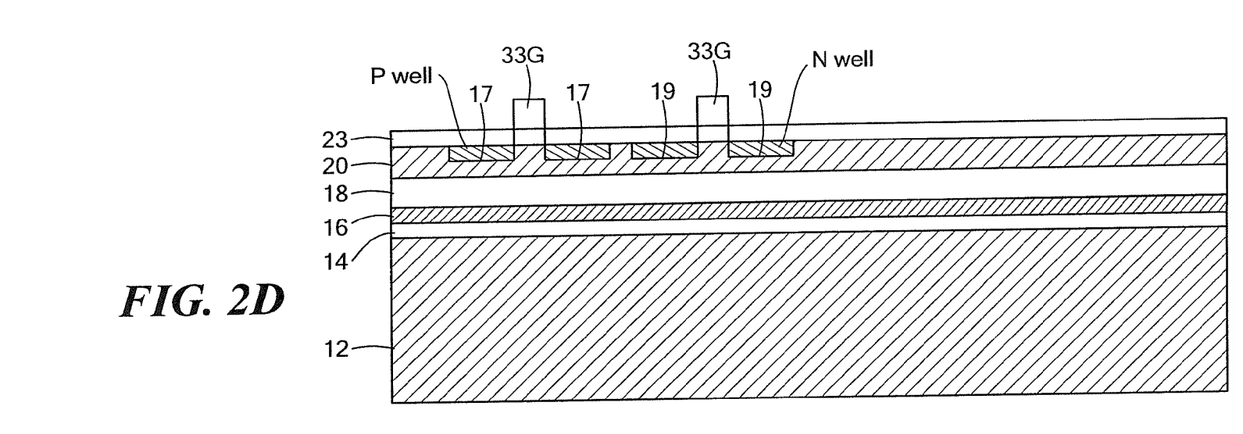
Figure 2E:
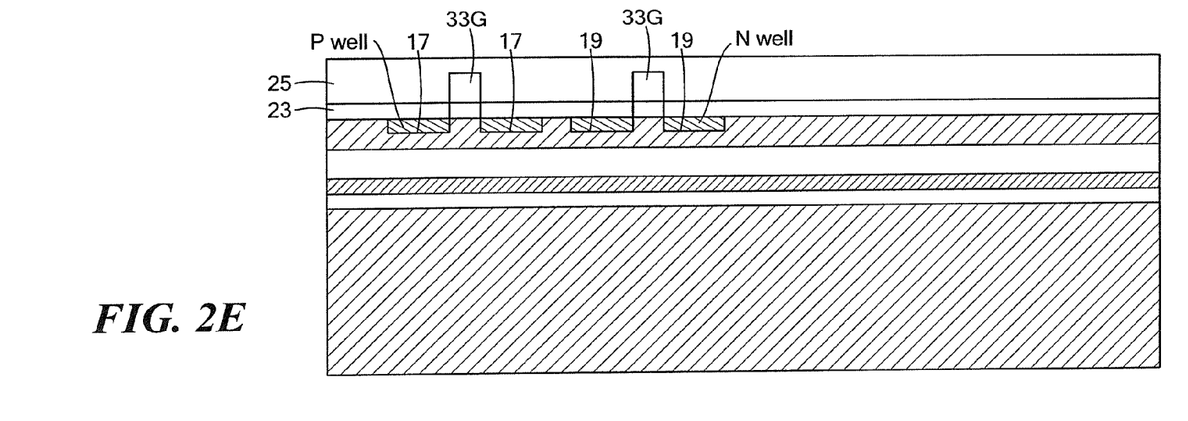
Figure 2F:
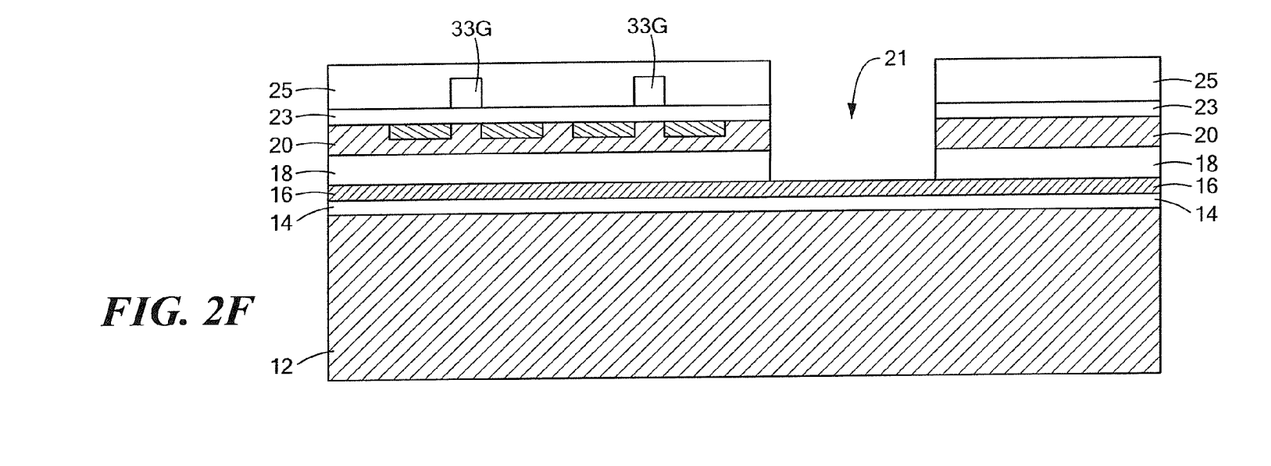
Figure 2G:
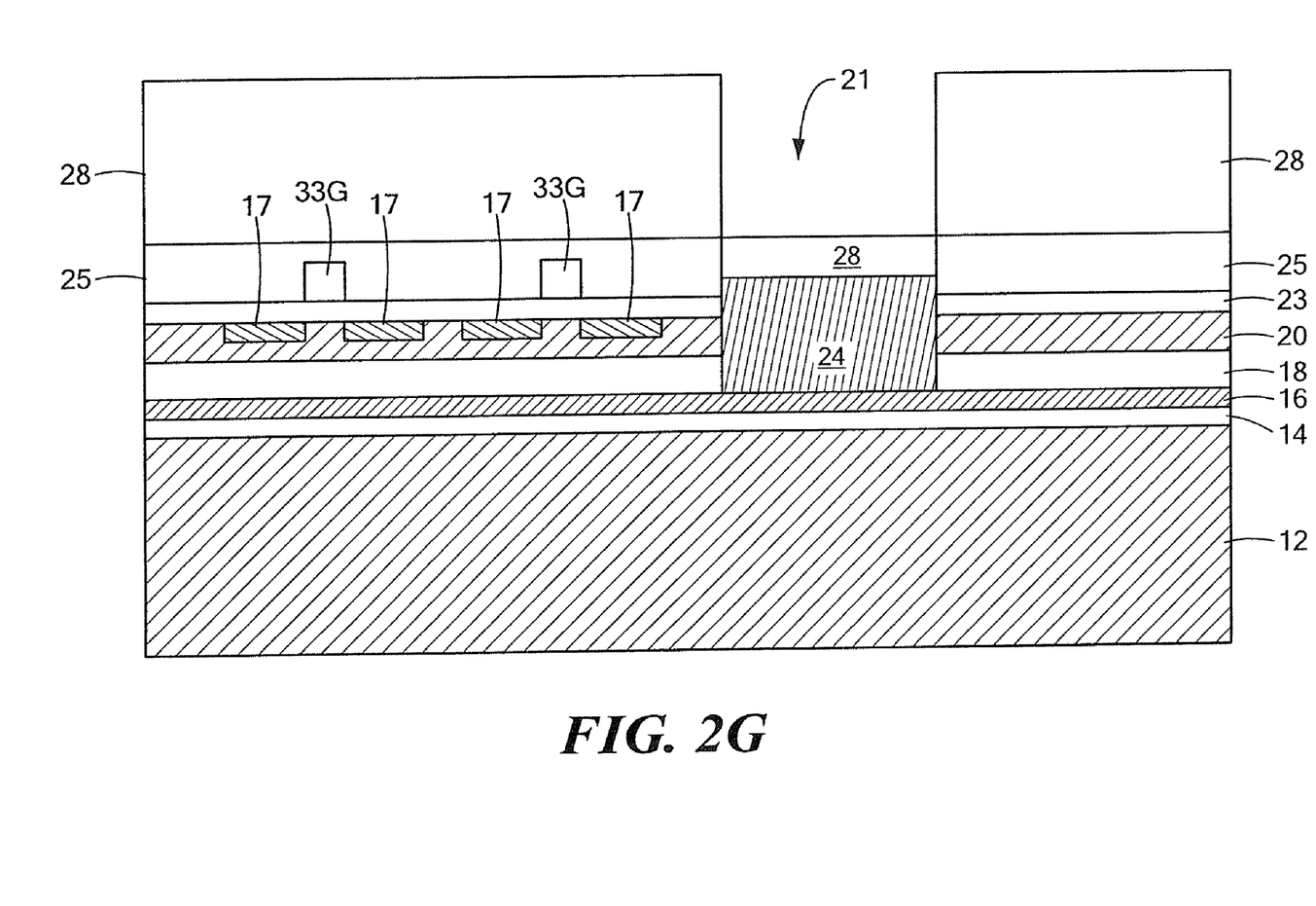
Figure 2H:
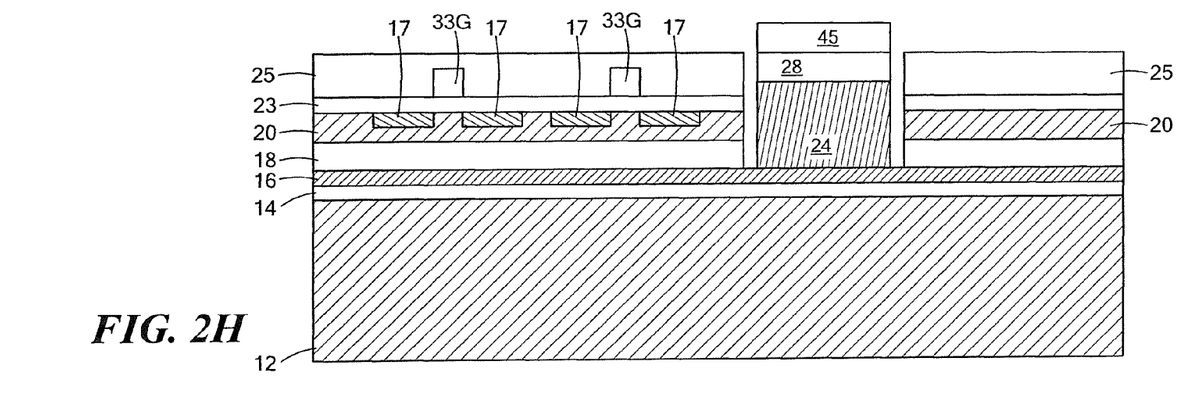
Figure 2I:
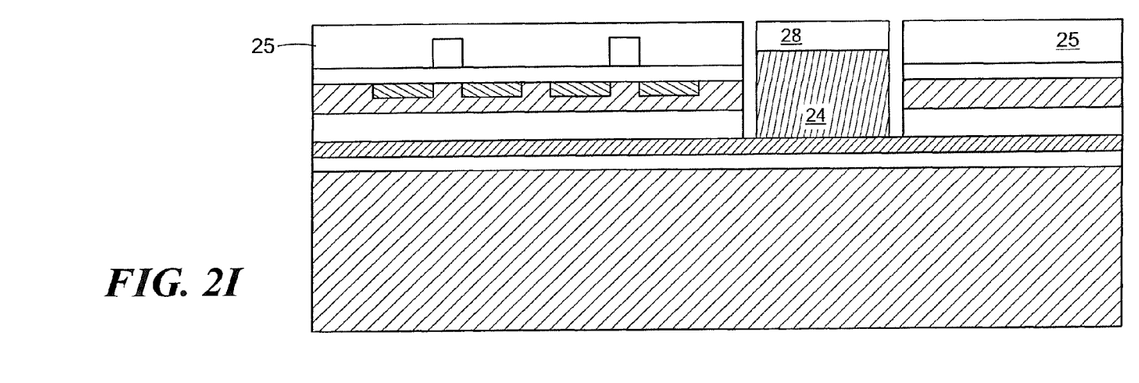
Figure 2J:
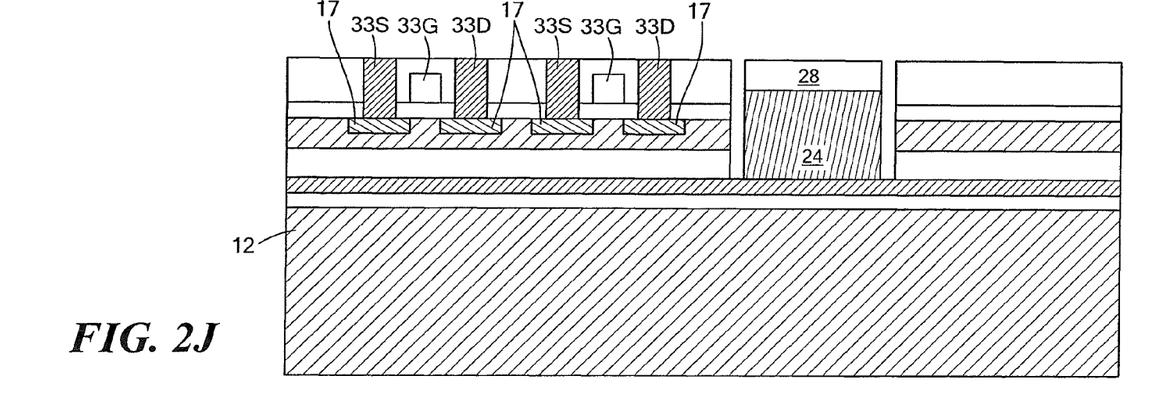
Figure 2K:
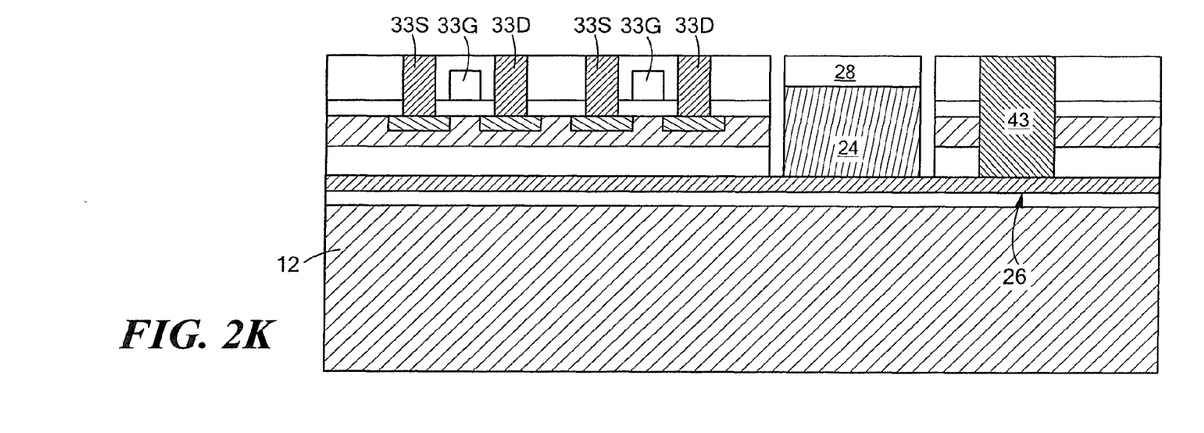
Figure 2L:
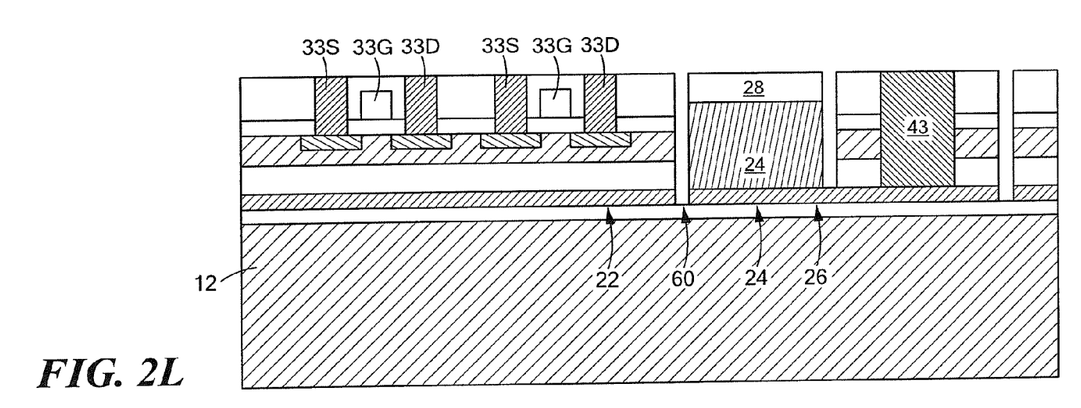
Figure 2M:
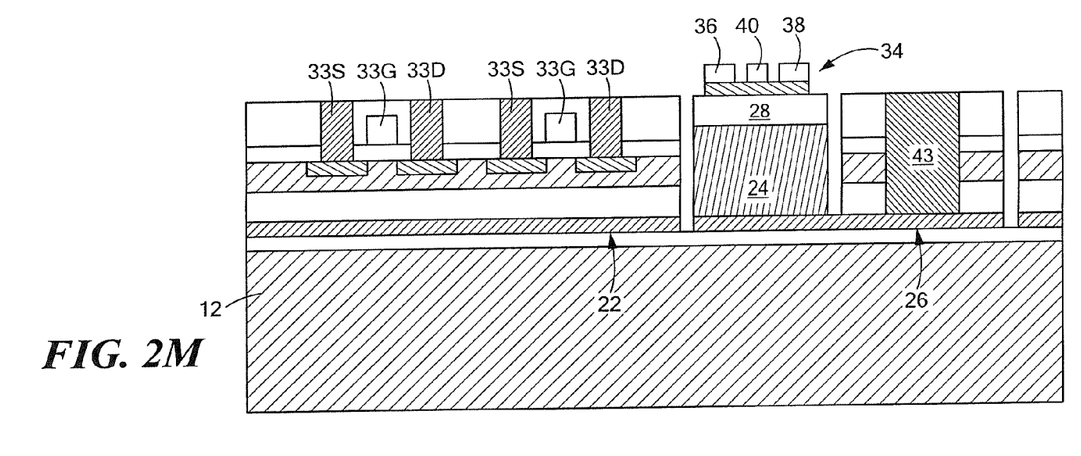
Figure 2N:
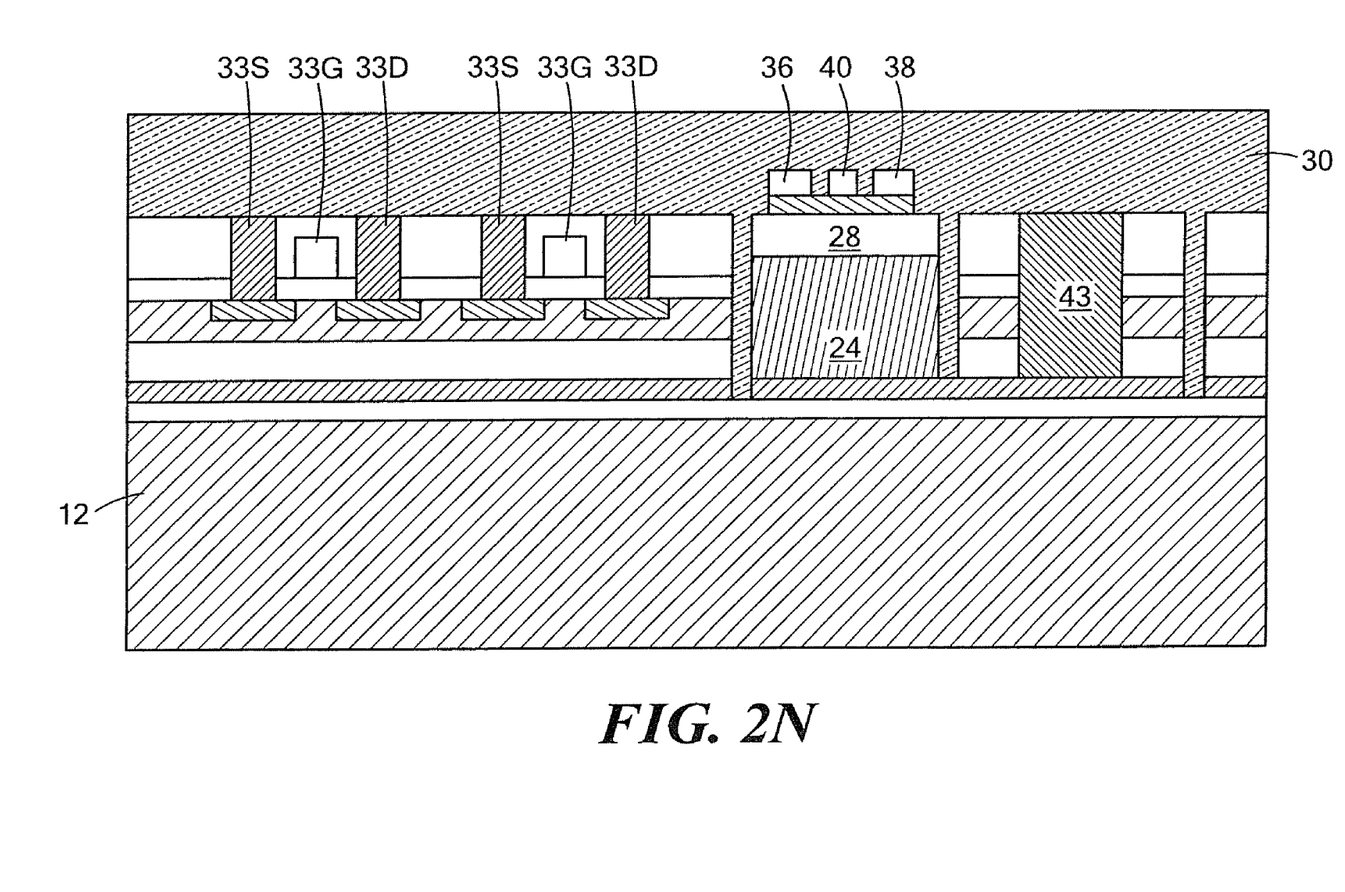

Referring now to FIGS. 2A-2N, the process for forming the structure 10 is shown. Thus, as shown in FIG. 2A, a structure having the silicon substrate 12, the silicon dioxide layer 14 on the substrate 12, the III-V seed layer 16, here germanium, on the layer 14, the second silicon dioxide layer 18 on the seed layer 16, and the elemental semiconductor layer 20, here silicon, on the silicon dioxide layer 18, is provided.

Next, the gate dielectric layer 23 is formed on the silicon the elemental semiconductor layer 20, here silicon dioxide, although other dielectrics such as $HfO_2$ may be used, as shown in FIG. 2B.

Next, the gate electrodes 33G for the CMOS devices 32 are formed using any convention process, as shown in FIG. 2C.

Next, P and N type conductivity wells 17, 19 are formed in the layer 20 here using ion implantation to provide the structure shown in FIG. 2D.

Next, the silicon dioxide layer 25 is formed over the structure using any conventional process, here for example by thermal oxidation, to form the structure shown in FIG. 2E.

Next, a window 21 is etched through the layers 25, 23, 20, and 18, to expose the upper surface portion of the seed layer 16, to provide the structure shown in FIG. 2F. Here, the window 21 is etched primarily by dry etching except for a tiny remainder of silicon dioxide of layer 18 that is wet etched using buffered HF acid so that the seed layer 16 is not exposed to the plasma used in the dry etch. It is noted that that P and N wells 17, 19 are ion implanted into the elemental semiconductor silicon layer 20, as shown.

Next, a compound semiconductor, here III-V material is grown epitaxially over the surface of the structure shown in FIG. 2F to produce the compound semiconductor buffer layer 24. Next, the compound semiconductor material is grown epitaxially over the structure it being noted that this compound semiconductor material grows as a single crystal layer 28 over the buffer layer 24 but grows as a polycrystalline layer over the silicon dioxide layer 25, as indicated in FIG. 2G.

Next, an etch mask 45 is formed on the single crystalline material 28. Using the mask 45, the polycrystalline layer over the silicon dioxide layer 25 is removed as well as lower quality single crystalline device/buffer material (i.e., layers 24, 28), near the window 21 (FIG. 2F) edges, as shown in FIG. 2H. Here, the polycrystalline material is removed using a wet etch, dry etch, or a combination of both.

Next, the mask 45 is removed as shown in FIG. 2I.

Next, the CMOS contacts 33S, 33D and 33G are formed using any conventional process to form the structure shown in FIG. 2J. It should be noted that if the CMOS wiring can withstand III-V growth temperatures, (such as refractory metals such as tungsten), this step can be completed prior to the III-V growth described in connection with FIG. 2G.

Next, the layers 25, 23, 20, and 18 are selectively etched to expose an upper surface portion of the seed layer 16 and the extension provided by the electrically conductive column shaped structure 43 is formed in ohmic contact with the exposed portion of the seed layer 16 to provide the structure shown in FIG. 2K.

Next, the seed layer 16 is electrically isolated into the portions 22 and 26, by etching, as shown in FIG. 2L by opening 60. Also, the source and drain contacts 33S and 33D are formed as shown in FIG. 2L.

Next, the FET 34 is formed in the compound semiconductor 28 using any conventional process, to produce the structure shown in FIG. 2M.

Next, the upper surface of the structure shown in FIG. 2M is covered with the insulating layer 30, as shown in FIG. 2N.

Next, electrical interconnects 36 are formed to electrically interconnect the CMOS and FET, as shown in FIG. 1. The electrical interconnects may be gold or copper. The formation of copper interconnects is described in copending application Ser. No. 12/356,254, filed Jan. 20, 2009, assigned to the same assignee as the present invention, the entire subject matter thereof being incorporated herein by reference.

Figure 3:
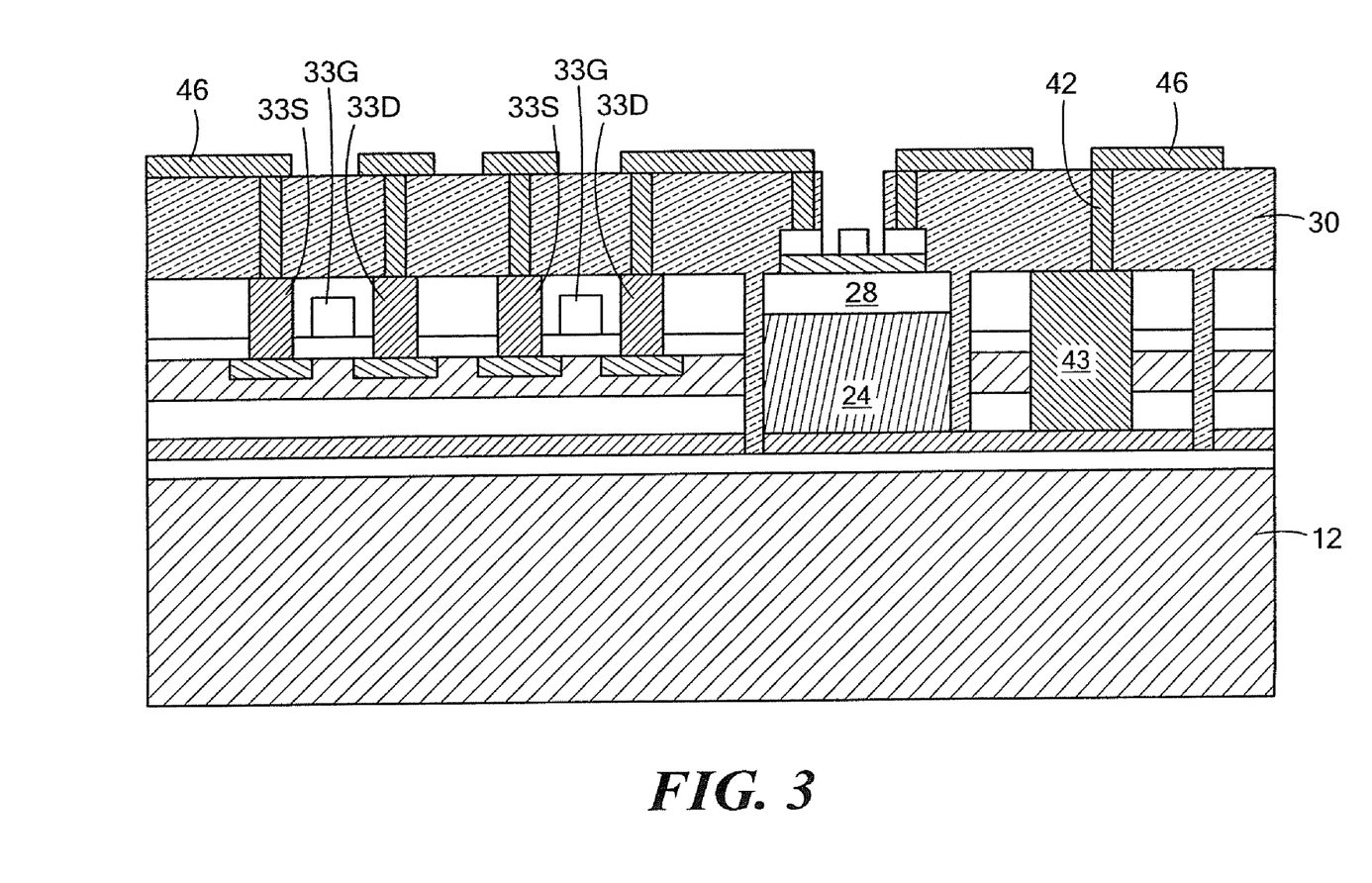
FIG. 3 is a diagrammatical cross sectional sketch of a semiconductor structure according to an alternative embodiment of the invention.

A number of embodiments of the invention have been described. Nevertheless, it will be understood that various modifications may be made without departing from the spirit and scope of the invention. For example, a cavity opening may be formed over the gate electrode of the FET, as shown in FIG. 3. Also, the CS layer may have formed therein many types of devices such as for example pHEMTs and HBTs based on some of the III-V compounds (GaAs, AlGaAs, InGaAs. Therefore, the invention should not be limited to either specific devices (e.g. AlGaAs/InGaAs/GaAs pHEMT or AlGaAs/GaAs HBTs) or even a specific group (e.g. III-V). Accordingly, other embodiments are within the scope of the following claims.

What is claimed is:
1. A semiconductor structure comprising:
a substrate;
a seed layer supported by the substrate;
an elemental semiconductor layer disposed over a first portion of the seed layer;
a compound semiconductor layer disposed on a second portion of the seed layer;
wherein the first portion of the seed layer is electrically insulated from the second portion of the seed layer;
a first semiconductor device formed in the elemental semiconductor layer;
a second semiconductor device formed in the compound semiconductor layer;
wherein the second semiconductor device includes:
a first electrode in contact with a first region of the compound semiconductor layer;
a second electrode in contact with a second region of the compound semiconductor layer;
a third electrode;
wherein the third electrode controls carriers passing in a third region of the compound semiconductor layer disposed between the first region of the compound semiconductor layer and the second region of the compound semiconductor layer; and
a fourth electrode in electrical contact with the second portion of the seed layer.

2. The semiconductor structure recited in claim 1 wherein the first, second, and fourth electrodes extend vertically downward from an upper surface of the structure.

3. The semiconductor structure recited in claim 1 wherein the elemental semiconductor layer is a silicon layer.

4. The semiconductor structure recited in claim 3 wherein the compound semiconductor layer is a III-V layer.

5. The semiconductor structure recited in claim 4 wherein the first semiconductor device is a MOS device.

6. The semiconductor structure recited in claim 5 wherein the second semiconductor device is a FET device.

7. The semiconductor structure recited in claim 6 wherein the third electrode is a gate electrode and wherein first and second electrodes are source and drain electrodes.

8. The semiconductor structure recited in claim 7 wherein the fourth electrode is in ohmic contact with the seed layer.

9. The semiconductor structure recited in claim 1 wherein the fourth electrode is electrically isolated from the first, second and third electrodes.

10. The semiconductor structure recited in claim 9 the elemental semiconductor layer is a silicon layer.

11. The semiconductor structure recited in claim 10 wherein the compound semiconductor layer is a III-V layer.

12. The semiconductor structure recited in claim 11 wherein the first semiconductor device is a MOS device.

13. The semiconductor structure recited in claim 12 wherein the second semiconductor device is a FET device.

14. The semiconductor structure recited in claim 13 wherein the third electrode is a gate electrode and wherein first and second electrodes are source and drain electrodes.

15. The semiconductor structure recited in claim 14 wherein the fourth electrode is in ohmic contact with the seed layer.

* * * * *